(12) United States Patent
Mori et al.

(10) Patent No.: US 6,509,528 B1
(45) Date of Patent: Jan. 21, 2003

(54) PRINTED CIRCUIT BOARD AND MANUFACTURING PROCESS THEREOF

(75) Inventors: Shigeru Mori, Tokyo (JP); Yoshinori Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/690,750

(22) Filed: Oct. 18, 2000

(30) Foreign Application Priority Data

Oct. 20, 1999 (JP) .............................................. 11-298588

(51) Int. Cl.[7] .................................................. H05K 1/03
(52) U.S. Cl. ......................................... 174/255; 29/830
(58) Field of Search ................................. 174/255, 256, 174/261; 361/795; 29/830

(56) References Cited

U.S. PATENT DOCUMENTS

| | | | | |
|---|---|---|---|---|
| 5,418,689 A | * | 5/1995 | Alpaugh et al. ............. 361/792 |
| 5,432,675 A | * | 7/1995 | Sorimachi et al. .......... 361/719 |
| 5,432,677 A | * | 7/1995 | Mowatt et al. .............. 361/719 |
| 5,451,721 A | * | 9/1995 | Tsukada et al. ............. 174/261 |
| 5,785,789 A | * | 7/1998 | Gagnon et al. ............. 156/235 |
| 5,958,510 A | * | 9/1999 | Sivaramakrishnan et al. ........................ 427/255.6 |
| 6,028,367 A | * | 2/2000 | Yu ............................... 257/780 |
| 6,187,672 B1 | * | 2/2001 | Zhao et al. ................. 438/639 |

* cited by examiner

Primary Examiner—David L. Talbott
Assistant Examiner—Jeremy Norris
(74) Attorney, Agent, or Firm—Sughrue Mion, PLLC

(57) ABSTRACT

A printed circuit board and a manufacturing method thereof can realize a thick film laminated structure of single resin material of low dielectric constant without reinforcement material. The printed circuit board is formed with an insulation layer of composite structure of a first resin material of low dielectric constant and a first general base material having different relative dielectric constants, and the insulation layer is disposed between conductor circuits.

11 Claims, 5 Drawing Sheets

INSULATION LAYER OF COMPOSITE STRUCTURE

INSULATION LAYER OF FR-4 STRUCTURE

FIG. 3

| ITEM | COMPOSITE STRUCTURE | FR-4 STRUCTURE |
|---|---|---|
| MICRO STRIP LINE WIDTH | 0.64 mm | 0.53 mm |
| COPPER FOIL STRIP | 0.018 mm | 0.018 mm |
| THICKNESS OF INSULATION LAYER | 0.25 mm | 0.3 mm |
| RELATIVE DIELECTRIC CONSTANT | 2.7 | 4.6 |
| IMPEDANCE (DESIGN VALUE) | 50 Ω | 50 Ω |
| FREQUENCY | 1 | 1 |
| RETURN LOSS (dB) | −19.4 | −29.5 |
| PATTERN LOSS (dB) | −0.32 | −0.43 |

PRINTED CIRCUIT BOARD AND MANUFACTURING PROCESS THEREOF

BACKGROUND OF THE INVENTION

1. Field of the Invention

The present invention relates to a printed circuit board and a manufacturing process thereof suitable for realizing higher wiring density.

2. Description of the Related Art

A printed circuit board of a laminated structure is formed by laminating a plurality of wiring layers in order to realize higher wiring density. Such printed circuit board is inherent for down-sizing of an electronic equipments.

In the meanwhile, when the printed circuit board of the laminated structure is manufactured with various resin materials having low dielectric constant without employing a reinforcement material, such as glass cloth or the like, several hundreds µm of a laminated layer thickness is required in a single resin material of low dielectric constant in order to obtain a desired performance.

A thick laminated structure of the single resin material of low dielectric constant without reinforcement material is quite difficult to manufacture. In addition, by increasing layer thickness, mechanical strength is lowered.

SUMMARY OF THE INVENTION

The present invention has been worked out in order to solve the problem set forth above. Therefore, it is an object of the present invention to provide a printed circuit board and a manufacturing method thereof which can realize a thick film laminated structure of single resin material of low dielectric constant without reinforcement material.

According to the first aspect of the present invention, a printed circuit board is formed with an insulation layer of composite structure of a first resin material of low dielectric constant and a first general base material having different relative dielectric constants, and the insulation layer is disposed between conductor circuits.

The first base material may be stacked on a second general base material as a core material, the first resin material of low dielectric constant may be stacked on the first general base material, a first grounding conductor as the conductor circuit may be formed between the first and second general base materials, a plurality of conductive patterns may be arranged between the first general base material and the first resin material of low dielectric constant, and a line conductor as the conductor circuit may be arranged on the surface of the first resin layer of low dielectric constant.

The first general base material may be provided a thickness of several hundreds µm and the first resin material of low dielectric constant is provided a thickness of several tens µm. A second resin material of low dielectric constant may be stacked on the first resin material of the first resin material of low dielectric constant covering the line conductor, a third general base material may be stacked on the second resin material of low dielectric constant, a second grounding conductor is arranged on the third general base material.

According to the second aspect of the present invention, a manufacturing process of a printed circuit board comprises:

a first step of forming an insulation layer of a composite structure of a first resin material of low dielectric constant and a first general base material having different relative dielectric constants; and a second step of interposing the insulation layer between conductor circuits.

The first step may comprise a third step of stacking the first general base material on a second general base material;

a fourth step of stacking the first resin layer of low dielectric constant on the first general base material;

the second step may comprise a fifth step of arranging a first grounding conductor as the conductor circuit between the first and second general base material;

a sixth step of arranging a plurality of conductor patterns between the first general base material and the first resin material of low dielectric constant; and a seventh step of arranging a line conductor as the conductor circuit on a surface of the first resin material of low dielectric constant.

The first and third step may include an eighth process of forming the first general base material in a thickness of several hundreds µm, and the first and fourth steps may include a ninth step of forming the first resin material of low dielectric constant in a thickness of several tens µm. The fourth step may include a tenth step of stacking a second resin material of low dielectric constant on the first resin material of low dielectric constant covering the line conductor;

a eleventh step of stacking a third general base material on the second resin material of low dielectric constant; and a twelfth step of arranging a second grounding conductor on the third general base material.

The conductor circuit may have a micro strip line structure or a balance type strip line structure.

In the printed circuit board and the manufacturing process thereof according to the present invention, the insulation layer is formed in composite structure of the first resin material of low dielectric constant and the first general base material having different relative dielectric constant, and the insulation layer is disposed between the conductor circuit to make the relative dielectric constant of the insulation layer of composite structure dependent on the value of relative dielectric constant of the first resin material of low dielectric constant.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings:

FIG. 3 is an illustration showing a comparison of electric characteristics in the insulation layer of composite structure and the insulation layer of FR-4 structure;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessary obscurity of the present invention.

(First Embodiment)

Figure 1:
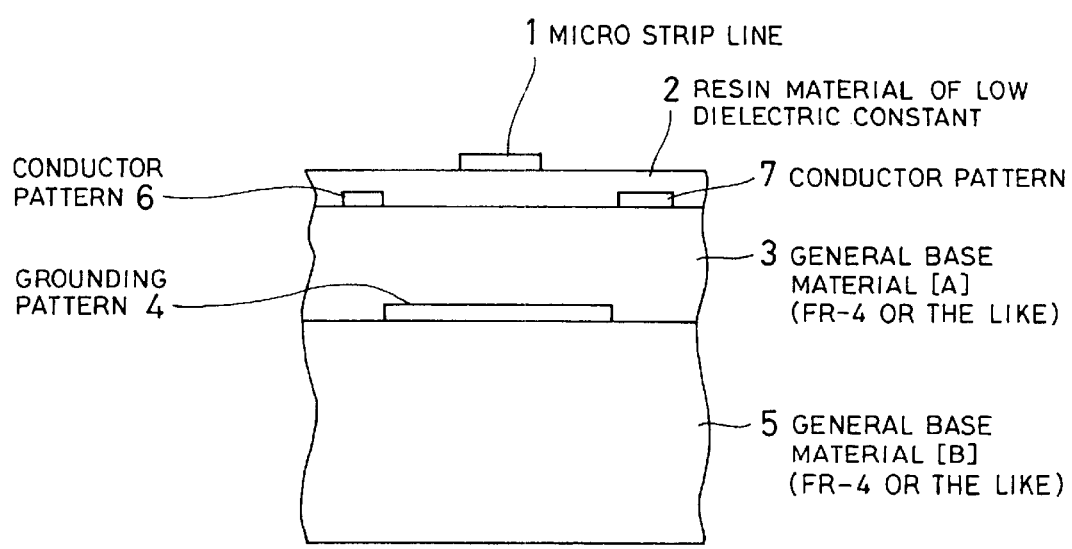
FIG 1. is a section showing a structure of the first embodiment of an insulation layer of a composite structure and a micro strip structure of a printed circuit board of the present invention.

FIG. 1 is a section showing the first embodiment of an insulation layer of composite structure and a micro strip structure of a printed circuit board according to the present invention, FIG. 2 is a section showing a comparison between the insulation layer of composite structure shown in FIG. 1 and an insulation layer of FR-4 structure, and FIG. 3 is an illustration showing a comparison of electric characteristics in the insulation layer of composite structure shown in FIG. 1 and the insulation layer of FR-4 structure.

The printed circuit board shown in FIG. 1 has a general base material [B] (FR-4 or the like) 5 as a second general base material to be taken as a core material. On the general base material [B] (FR-4 or the like), a grounding pattern 4 as a first grounding pattern is arranged. A general base material [A] (FR-4 or the like) 3 as a first general base material and as an insulation layer is stacked in a thickness of several hundreds μm covering the grounding pattern 4.

On the general base material [A] (FR-4 or the like) 3, a conductor pattern 6, a conductor pattern 7 and so forth are arranged. A resin material 2 of low dielectric constant as the first synthetic resin of low dielectric constant and as an insulation layer is stacked on the first general base material [A] (FR-4 or the like) 3 in a thickness of several tens μm covering the conductor pattern 6, the conductor pattern 7 and so forth. On the surface of the resin material 2 of low dielectric constant, a micro strip line 1 is arranged.

With such construction, an insulation layer of composite structure is formed with the resin material 2 of low dielectric constant stacked between the micro strip line 1 and the grounding pattern 4 and the general base material [A] (FR-4 or the like) 3. On the other hand, since a relative dielectric constant in the insulation layer of the composite structure depends on relative dielectric constant characteristics of the resin material 2 of low dielectric constant, an impedance matching circuit is constructed with a value of relative dielectric constant of the resin material 2 of the low dielectric constant.

Figure 5:
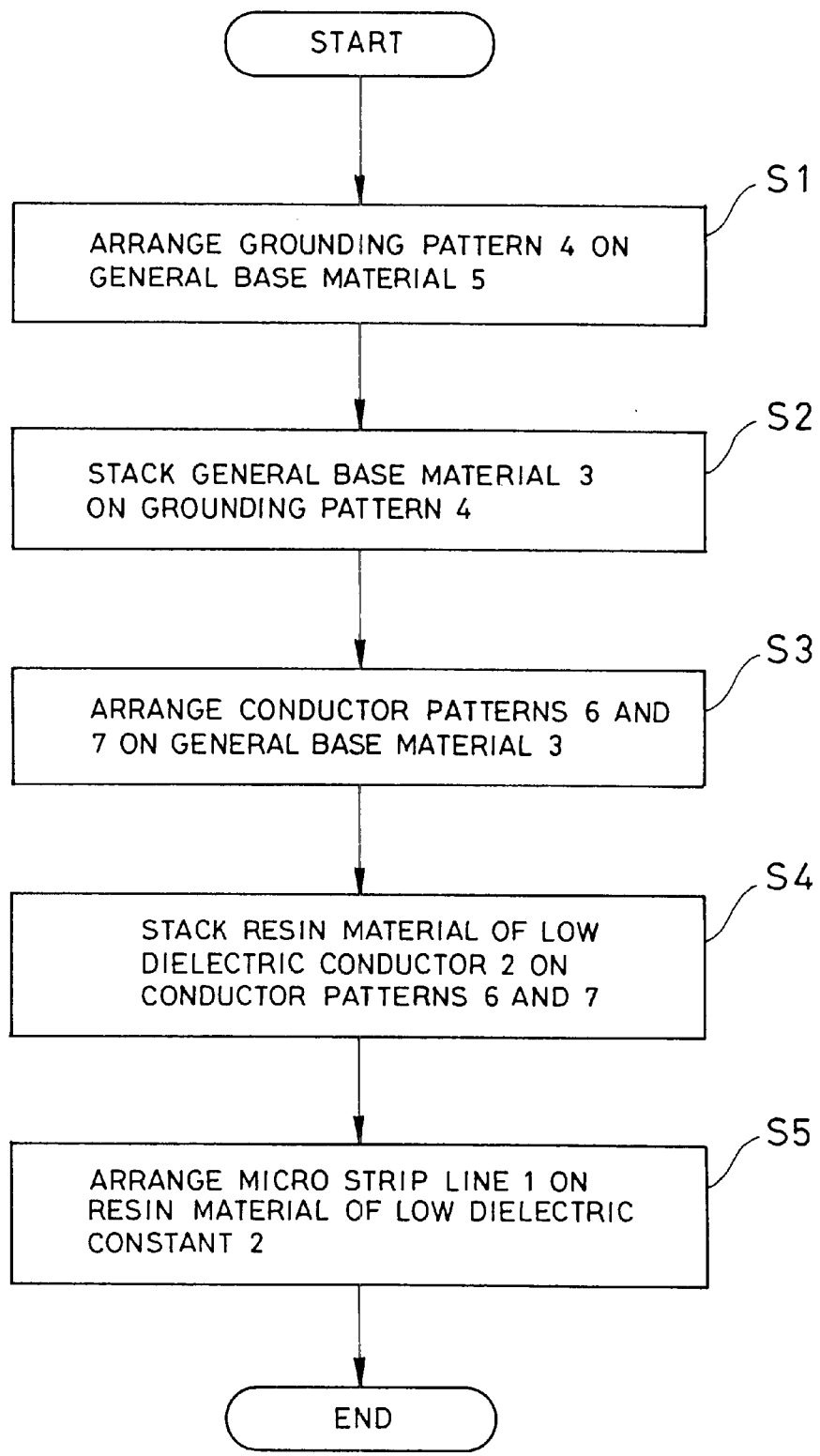
FIG. 5 is a flowchart showing a manufacturing process of the printed circuit board according to the present invention.

Next, a manufacturing method of the printed circuit board of the construction set forth above will be discussed with reference to FIG. 5. FIG. 5 is a flowchart showing a manufacturing process of the printed circuit board of the present invention.

At first, with taking the general base material [B] (FR-4 or the like) 5 as the core material, the grounding pattern 4 is arranged over the core material (S1). Then, the general base material [A] (FR-4 or the like) 3 as the insulation layer is stacked with covering the grounding pattern 4 in a thickness of several hundreds μm (S2). Next, on the general base material [A] (FR-4) or the like) 3, the conductor pattern 6, the conductor pattern 7 and so forth are arranged (S3). The resin material 2 of low dielectric constant as the insulation layer is stacked covering the conductor pattern 6, the conductor pattern 7 and so forth in a thickness of several tens μm (S4). Next, on the surface of the resin material 2 of low dielectric constant, the micro strip line 1 is arranged (S1).

Here, discussion will be given for the case where the insulation layer of the composite structure and the insulation layer of FR-4 structure are compared with reference to FIGS. 2A, 2B and 3.

Figure 2A:
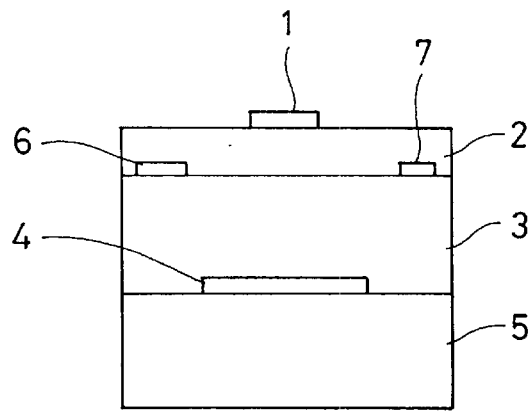
FIGS. 2A and 2B are sections showing a comparison between the insulation layer of composite structure and an insulation layer of FR-4 structure.
Figure 2B:
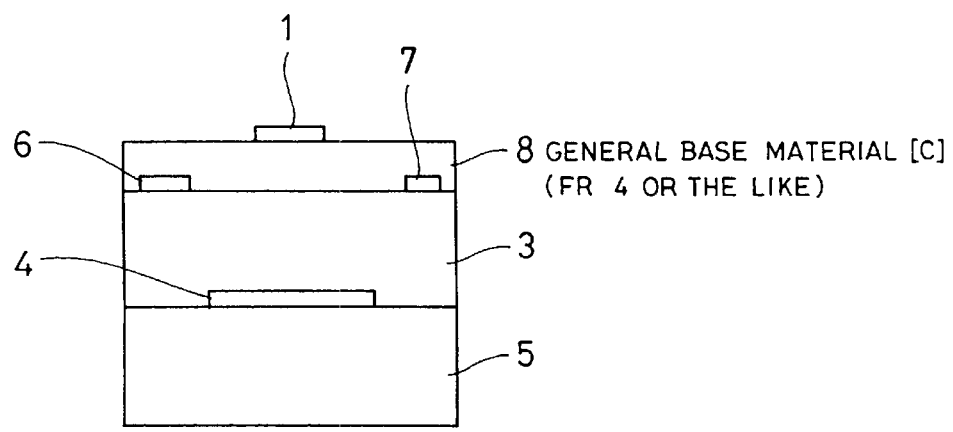

FIG. 2A shows the insulation layer of composite structure and FIG. 2B shows the insulation layer of FR-4 structure. FIG. 3 shows comparison of numerical value of a design value and result of test with respect to respective elements with constructing the same impedance matching circuit by respective insulation layer of the composite structure and the insulation layer of FR-4 structure.

The insulation layer of the composite structure of FIG. 2A and the insulation layer of FR-4 structure of FIG. 2B are differentiated whether the insulation layer on the general base material [A] (FR-4 or the like) 3 is the resin material 2 of low dielectric constant or the general base material [C] (FR-4 or the like) 8.

As shown in FIG. 3, with the design of the same impedance, it can be appreciated that the relative dielectric constant of the insulation layer of the composite structure can be set by a numerical value of the resin material 2 of low dielectric constant by employing the insulation layer of the composite structure. On the other hand, in case of the insulation layer of the composite structure, the width of the micro strip line 1 can also be set wider than in the insulation layer of the FR-4 structure. Furthermore, the thickness of the insulation layer can be made thinner. In addition, good results can be attained even in electrical characteristics of return loss and pattern loss.

As set forth above, in the first embodiment, the insulation layer is formed by a composite structure of the resin material 2 of low dielectric constant and the general base material [A] (FR-4 or the like) 3 having different relative dielectric constant, and the insulation layer is interposed between the micro strip line 1 and the grounding pattern 4 as conductor circuits to make the relative dielectric constant of the insulation layer of the composite structure dependent on a value of the relative dielectric constant value of the resin material 2 of low dielectric constant. Therefore, thick film laminated structure of single resin material of low dielectric constant can be realized without a reinforcement material without causing lowering of mechanical strength.

(Second Embodiment)

Figure 4:
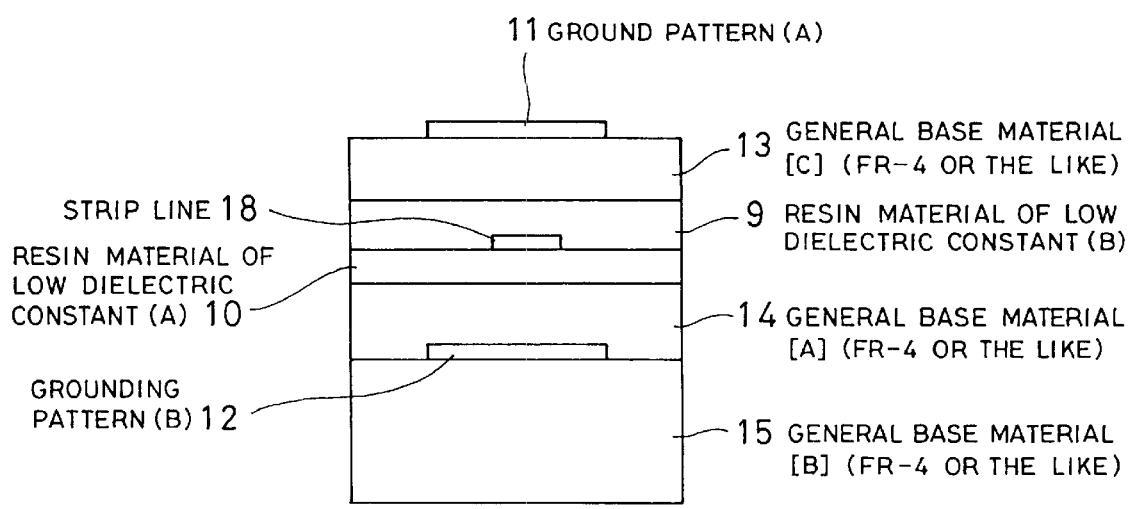
FIG. 4 is a section showing a structure of the second embodiment of an insulation layer of a composite structure and a balance type strip line structure of a printed circuit board of the present invention.

FIG. 4 is a section showing a structure of the second embodiment of an insulation layer of a composite structure and a balance type strip line structure of a printed circuit board of the present invention.

The printed circuit board shown in FIG. 4 has a general base material [B] (FR-4 or the like) 15 as a second general base material to be taken as a core material. On the general base material [B] (FR-4 or the like) 15, a grounding pattern 12 as a first grounding pattern is arranged. A general base material [A] (FR-4 or the like) 14 as a first general base material and as an insulation layer is stacked covering the grounding pattern [B] 12.

On the general base material [A] (FR-4 or the like) 14, a resin material (A) 10 of low dielectric constant as the first resin material of the low dielectric constant and the insulation layer is stacked. On the resin material (A) 10 of low dielectric constant, a strip line 18 is arranged.

On the resin material (A) 10 of low dielectric constant, a resin material (B) 9 of low dielectric constant as the second resin material of low dielectric constant is stacked covering the strip line 8. On the resin material (B) 9 of low dielectric constant, the general base material [C] (FR-4 or the like) 13 as the third general base material is stacked. On the general base material [C] (FR-4 or the like) 13, grounding pattern (A) 11 as the second grounding pattern is arranged.

With such construction, a lower insulation layer of the composite structure of the general base material [A] (FR-4 or the like) 14 and the resin material (A) 10 of low dielectric constant is formed and an upper insulation layer of composite structure of the resin material (B) 9 of low dielectric constant and the general base material [C] (FR-4 or the like) 13 is formed.

As set forth above, in the second embodiment, the lower insulation layer of the composite structure of the general base material [A] (FR-4 or the like) 14 and the resin material (A) 10 of low dielectric constant is formed and the upper insulation layer of composite structure of the resin material (B) 9 of low dielectric constant and the general base material [C] (FR-4 or the like) 13 is formed, and the relative dielectric constants of respective insulation layer are dependent on the values of relative dielectric constants of the resin material (A) 10 of low dielectric constant and the resin material (B) 9 of low dielectric constant, the thick film laminated structure of single resin material of low dielectric constant can be realized without a reinforcement material without causing lowering of mechanical strength.

As set forth above, with the printed circuit board and the manufacturing method thereof, the insulation layer is formed with the composite structure of the first resin material of low dielectric constant and the first general base material having different relative dielectric constants, and the insulation layer is disposed between the conductor circuits to make relative dielectric constant of the insulation layer dependent upon the value of the relative dielectric constants of the resin material (A) 10 of low dielectric constant and the resin material (B) 9 of the low dielectric constant. Thus, thick film laminated structure of single resin material of low dielectric constant can be realized without a reinforcement material without causing lowering of mechanical strength.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A printed circuit board formed with an insulation layer of composite structure of a first resin material of low dielectric constant and a first general base material having different relative dielectric constants, and said insulation layer being disposed between conductor circuits, wherein said first base material is stacked on a second general base material as a core material, said first resin material of low dielectric constant is stacked on said first general base material, a first grounding conductor as said conductor circuit is formed between said first and second general base materials, a plurality of conductive patterns are arranged between the first general base material and the first resin material of low dielectric constant, and a line conductor as said conductor circuit is arranged on the surface of said first resin layer of low dielectric constant.

2. A printed circuit board as set forth in claim 1, wherein said first general base material is provided a thickness of several hundreds $\mu$m and said first resin material of low dielectric constant is provided a thickness of several tens $\mu$m.

3. A printed circuit board as set forth in claim 1, wherein a second resin material of low dielectric constant is stacked on said first resin material of said first resin material of low dielectric constant covering said line conductor, a third general base material is stacked on said second resin material of low dielectric constant, a second grounding conductor is arranged on the third general base material.

4. A printed circuit board as set forth in claim 3, wherein said conductor circuit has a balance type strip line structure.

5. A printed circuit board as set forth in claim 1, wherein said conductor circuit has a micro strip line structure.

6. A manufacturing process of a printed circuit board comprising:

a first step of forming an insulation layer of a composite structure of a first resin material of low dielectric constant and a first general base material having different relative dielectric constants, wherein said first resin material is formed from a single substance and stacked on said first general base material; and a second step of interposing said insulation layer between conductor circuits.

7. A manufacturing process of a printed circuit board as set forth in claim 6, wherein said first and third step include an eighth process of forming said first general base material in a thickness of several hundreds $\mu$m, and said first and fourth steps include a ninth step of forming said first resin material of low dielectric constant in a thickness of several tens $\mu$m.

8. A manufacturing process of a printed circuit board as set forth in claim 6, wherein said conductor circuit has a micro strip line structure.

9. A manufacturing process of a printed circuit board comprising:

a first step of forming an insulation layer of a composite structure of a first resin material of low dielectric constant and a first general base material having different relative dielectric constants; and a second step of interposing said insulation layer between conductor circuits, wherein, said first step comprises a third step of stacking said first general base material on a second general base material;

a fourth step of stacking said first resin layer of low dielectric constant on said first general base material;

said second step comprises a fifth step of arranging a first grounding conductor as said conductor circuit between said first and second general base material;

a sixth step of arranging a plurality of conductor patterns between said first general base material and said first resin material of low dielectric constant; and a seventh step of arranging a line conductor as said conductor circuit on a surface of said first resin material of low dielectric constant.

10. A manufacturing process of a printed circuit board as set forth in claim 9, wherein said fourth step includes a tenth step of stacking a second resin material of low dielectric constant on said first resin material of low dielectric constant covering said line conductor;

a eleventh step of stacking a third general base material on said second resin material of low dielectric constant; and a twelfth step of arranging a second grounding conductor on said third general base material.

11. A manufacturing process of a printed circuit board as set forth in claim 10, wherein said conductor circuit has a balance type strip line structure.

* * * * *